United States Patent
Takahashi

(10) Patent No.: US 7,313,862 B2
(45) Date of Patent: Jan. 1, 2008

(54) METHOD OF MOUNTING COMPONENTS ON A PCB

(75) Inventor: Hideki Takahashi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/372,087

(22) Filed: Mar. 10, 2006

(65) Prior Publication Data

US 2006/0207091 A1    Sep. 21, 2006

(30) Foreign Application Priority Data

Mar. 18, 2005 (JP) .............................. 2005-078496

(51) Int. Cl.
*H05K 3/30* (2006.01)
(52) U.S. Cl. .............................. 29/833; 29/832; 29/840
(58) Field of Classification Search .................. 29/825, 29/830, 832, 833, 840
See application file for complete search history.

(56) References Cited

U.S. PATENT DOCUMENTS

| | | | |
|---|---|---|---|
| 5,943,217 A * | 8/1999 | Hashimoto | 361/777 |
| 6,201,193 B1 * | 3/2001 | Hashimoto | 174/260 |
| 6,365,841 B1 | 4/2002 | Takigami | |
| 6,955,942 B2 * | 10/2005 | Kobayashi et al. | 438/106 |
| 2003/0209815 A1 * | 11/2003 | Ito et al. | 257/797 |

FOREIGN PATENT DOCUMENTS

| | | |
|---|---|---|
| JP | 11-40907 | 2/1999 |
| JP | 11-135939 | 5/1999 |
| JP | 11-220247 | 8/1999 |
| JP | 2003-304098 | 10/2003 |
| JP | 3558511 | 5/2004 |

* cited by examiner

*Primary Examiner*—Carl J. Arbes
(74) *Attorney, Agent, or Firm*—Oblon, Spivak, McClelland, Maier & Neustadt, P.C.

(57) ABSTRACT

A printed wiring board is disclosed. The printed wiring board includes a board recognition mark formed of a conductive foil, a first component land covered with resist, and a second component land not covered with the resist. The board recognition mark is defined by an area of the conductive foil exposed from a resist opening having the same shape and size as the conductive foil.

3 Claims, 8 Drawing Sheets

METHOD OF MOUNTING COMPONENTS ON A PCB

BACKGROUND OF THE INVENTION

1. Field of the Invention

The present invention generally relates to a technique for printing solder paste with use of a printing machine and mounting a component with use of an automatic mounter onto a printed wiring board including a board recognition mark, and particularly relates to a technique for properly mounting components on a printed wiring board including a component land covered with resist (hereinafter also referred to as an over resist type component land) and a component land not covered with the resist (hereinafter also referred to as a normal resist type component land) even if resist misalignment occurs.

2. Description of the Related Art

In recent years, printed wiring boards with "0603 size" small chip components mounted thereon have been increasing. The "0603 size" small chip components were developed in response to demand for components with smaller size and higher density, and have a size of 0.6 mm in length and 0.3 mm in width.

FIG. 8A shows a related art printed wiring board, wherein normal resist type component lands 5a and 5' are exposed through resist openings 8a and 8'a having sizes greater than the component lands 5a and 5'a, respectively. Conductive patterns 17a and 18a are extending from the component lands 5a and 5'a, respectively.

If a resist printing mask (not shown) used for forming resist 2a is positioned rightward relative to a predetermined location, an area S2a of the conductive pattern 18a exposed through the right resist opening 8'a is larger than an area S1a of the conductive pattern 17a exposed through the left resist opening 8a. That is, the substantial area of the component lands 5a is not equal to the substantial area of the component land 5'a.

Referring to FIG. 8C, when solder pastes 19a and 20a printed on such component lands 5a and 5'a are heated and melted by a reflow machine, a chip component 15a as small as the "0603 size" chip components might be pulled toward the component land 5'a having the larger substantial area and be partly lifted.

Referring then to FIG. 8B, to avoid such mounting failure, component lands 6a and 6'a having the same area by covering peripheries of conductive foils 22a and 22'a with the resist 2a are formed with an over resist method. The component lands 5a and 5'a formed by a normal resist method and the component lands 6a and 6'a formed by the over resist method are present on the same printed wiring board.

When a normal resist type component land and an over resist type component land are present on a printed wiring board, printing misalignment and mounting misalignment might occur for the following reasons.

The reasons of the occurrence of the printing and mounting misalignment are described with reference to a printed wiring board 1a of FIG. 5 including a board recognition mark 3a formed with the normal resist method, wherein rightward and downward misalignment of the resist 2a exists.

A resist printing mask (not shown) is placed on the printed wiring board including the board recognition mark 3a, the normal resist type component land 5a, and the over resist type component land 6a. The resist 2a is applied onto the printed wiring board 1a through the mask.

The resist opening 8a for the normal resist type component land 5a has a size large enough to accommodate the maximum resist misalignment resulting from misalignment between the printed wiring board 1a and the mask, so as to prevent the component land 5a from being covered with the resist 2a. Accordingly, the center point of the component land 5a is not affected by the resist misalignment, so that the positional relationship between the center point of the component land 5a and a center point 10a of the board recognition mark 3a is consistent with the design value of the printed wiring board 1a.

On the other hand, since the center point of the over resist type component land 6a is defined by the center point of a resist opening 9a, the center point of the component land 6a is displaced from a predetermined center point of the component land 6a by an amount corresponding to the resist misalignment.

This displacement is equal to the displacement $\Delta X$, $\Delta Y$ between the center point 10a of the board recognition mark 3a and a center point 11a of a resist opening 4a.

With reference to FIG. 6, in a process of mounting chip components 15a and 16a onto the printed wiring board 1a having the configuration as described above, solder pastes 13a and 14a are printed onto the component land 5a and 6a, respectively, of the printed wiring board 1a through a screen mask (not shown) with use of a printing machine.

More specifically, the printing machine captures an image of a recognition mark (not shown) of the screen mask with use of a CCD camera or the like so as to detect the center point of the recognition mark. The printing machine then captures an image of the board recognition mark 3a of the printed wiring board 1a so as to detect the center point 10a of the board recognition mark 3a.

The misalignment between the center point of the recognition mark of the screen mask and the center point 10a of the board recognition mark 3a of the printed wiring board 1a is corrected, so that openings of the screen mask are aligned with the corresponding component lands 5a and 6a. Then, the solder pastes 13a and 14a are printed onto the component lands 5a and 6a, respectively, through the corresponding openings of the screen mask.

The openings of the screen mask corresponding to the component lands 5a and 6a are formed based on design data of the printed wiring board 1a. Therefore, although the solder paste 13a is aligned with the normal resist type component land 5a, the solder paste 14a is misaligned with the over resist type component land 6a by $\Delta X$, $\Delta Y$.

Accordingly, printing position correction is required to equalize the amount of printing misalignment of the over resist type component land 6a to the amount of printing misalignment of the normal resist type component land 5a.

The following briefly describes a process of mounting the chip components 15a and 16a onto the component lands 5a and 6a, respectively, with use of an automatic mounter with reference to FIG. 7.

Before mounting the components 15a and 16a, the automatic mounter captures an image of the board recognition mark 3a of the printed wiring board with use of the CCD camera or the like so as to detect the center point 10a of the board recognition mark 3a.

The automatic mounter then mounts the component 15a in a position spaced apart from the center point 10a by a distance (L1, W1), and the component 16a in a position spaced apart from the center point 10a by a distance (L2, W2).

The distance L1, W1 is from the center point 10a of the board recognition mark 3a to the midpoint between conductive foils forming the normal resist type component lands 5a and 5'a, while the distance L2, W2 is from the center point 10a of the board recognition mark 3a to the midpoint between the conductive foils 22a and 22'a forming the over resist type component lands 6a and 6'a. These distances L1, W1 and L2, W2 are defined in a design specification of the printed wiring board 1a, and are registered in advance in a database together with the corresponding components 15a and 16a.

Therefore, although the component 15a is aligned with the normal resist type component lands 5a and 5'a without misalignment, the component 16a is misaligned with the over resist type component lands 6a and 6'a by αX, αY.

Accordingly, mounting position correction for equalizing the amount of misalignment of the over resist type component 16a and the amount of misalignment of the normal resist type component 15a or mounting position correction for correcting the misalignment of the over resist type component 16a is required.

Patent Document 1 discloses a technique for avoiding such problems. According to Patent Document 1, in addition to a recognition mark formed of conductive foil, a second mount recognition mark covered with resist is formed when the resist is applied for partially covering an over resist type component land. The first mount recognition mark formed of the conductive foil is used for mounting a component onto a normal resist type component land, and the second mount recognition mark covered with the resist is used for mounting a component onto the over resist type component land. Thus, the components are mounted on the corresponding component lands without misalignment.

However, because only one of the mount recognition marks can be detected during a solder paste printing process, one of the component lands is misaligned with the solder paste. Therefore, printing position correction is required.

<Patent Document 1> Japanese Patent Laid-Open Publication No. 11-40907

As can be understood from the above description, with the above-described related art techniques, if a component land covered with resist and a component land not covered with the resist are present on the same printed wiring board, misalignment between solder pastes and corresponding component lands and misalignment between components and the corresponding component lands due to resist misalignment cannot be avoided.

SUMMARY OF THE INVENTION

The present invention may solve at least one problem described above. A preferred embodiment of the present invention may properly mount components onto a printed wiring board including a component land covered with resist and a component land not covered with the resist even if resist misalignment occurs, thereby improving quality of the printed wiring board as well as increasing production efficiency of the printed wiring board.

According to an aspect of the present invention, there is provided a printed wiring board that comprises a board recognition mark formed of a conductive foil, a first component land covered with resist, and a second component land not covered with the resist, wherein the board recognition mark is defined by an area of the conductive foil exposed from a resist opening having the same shape and size as the conductive foil. The image of the board recognition mark may be captured by an imaging device such as a CCD camera so as to find the center point of the board recognition mark. Solder paste printing and component mounting may be performed with reference to the center point. Thus, it is possible to equalize the misalignment amount of the solder paste printing position and the component mounting position with respect to the first component land covered with the resist to the misalignment amount of the solder paste printing position and the component mounting position with respect to the second component land not covered with the resist if resist misalignment occurs.

According to the above described aspect of the present invention, it is possible to properly print solder pastes and mount components onto a component land covered with resist and a component land not covered with the resist on a printed wiring board even if resist misalignment occurs. Therefore, the need for printing position correction and mounting position correction can be eliminated.

DETAILED DESCRIPTION OF THE PREFERRED EMBODIMENT

Figure 1:
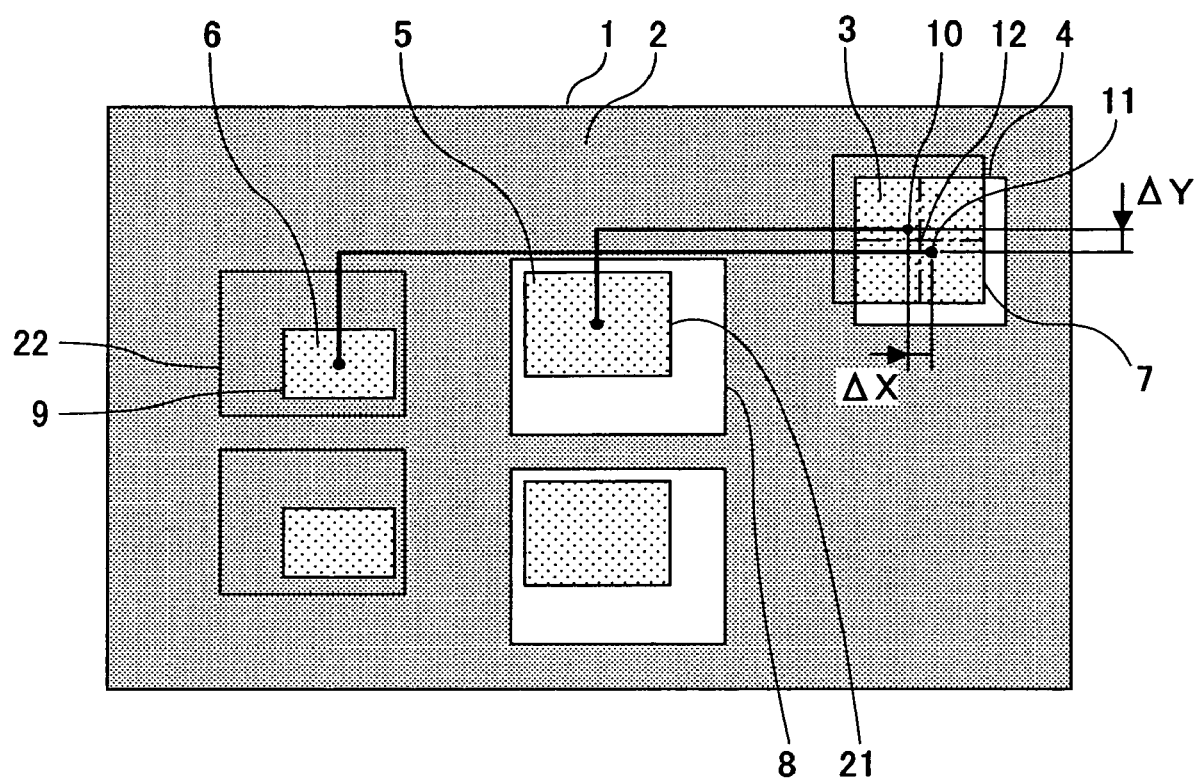
FIG. 1 is a schematic diagram illustrating a printed wiring board according to an embodiment of the present invention.
Figure 2:
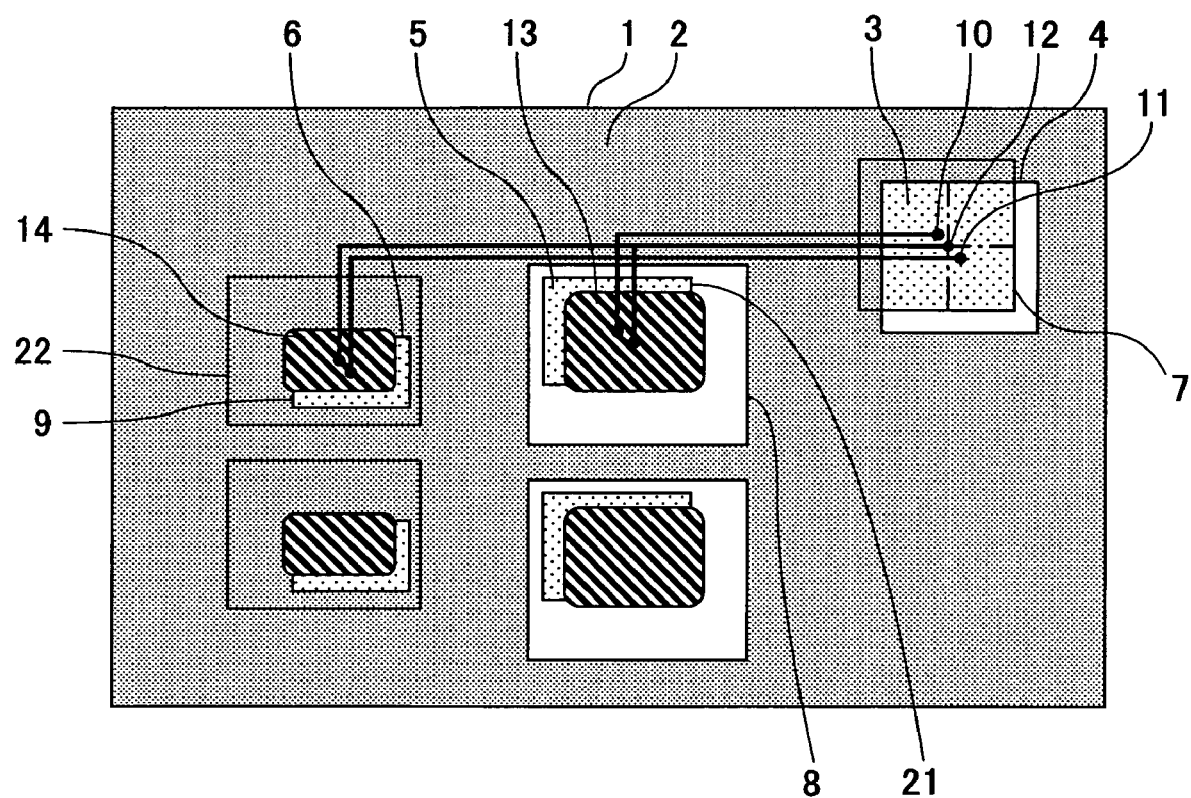
FIG. 2 is a schematic diagram illustrating the printed wiring board of FIG. 1 with solder paste printed thereon.
Figure 3:
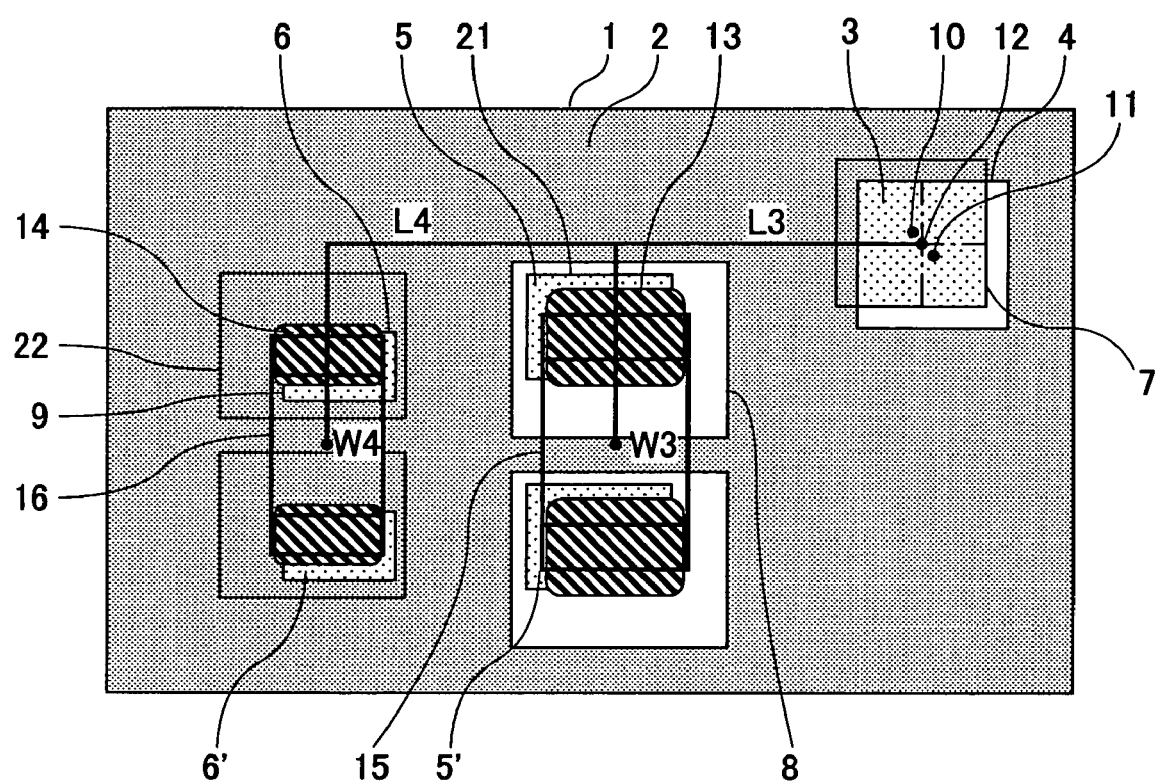
FIG. 3 is a schematic diagram illustrating a first example of the printed wiring board of FIG. 1 with components mounted thereon.
Figure 4:
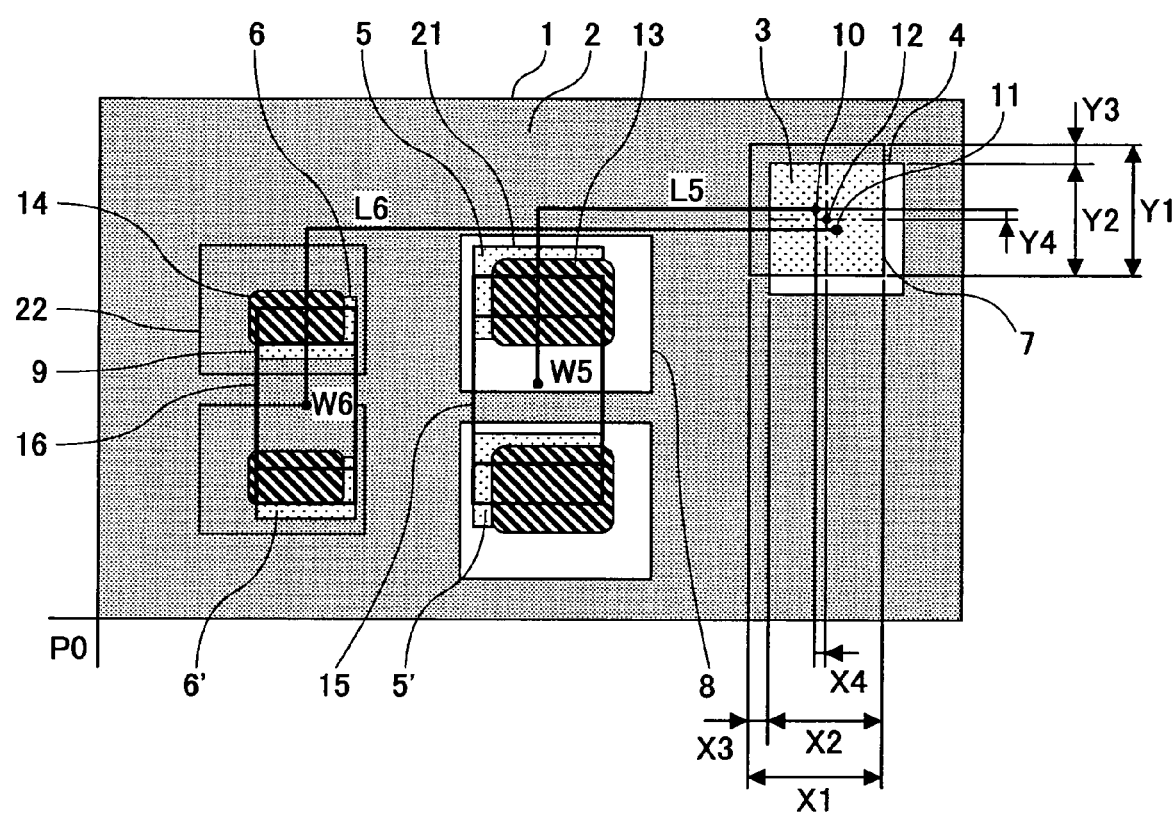
FIG. 4 is a schematic diagram illustrating a second example of the printed wiring board of FIG. 1 with components mounted thereon.
Figure 5:
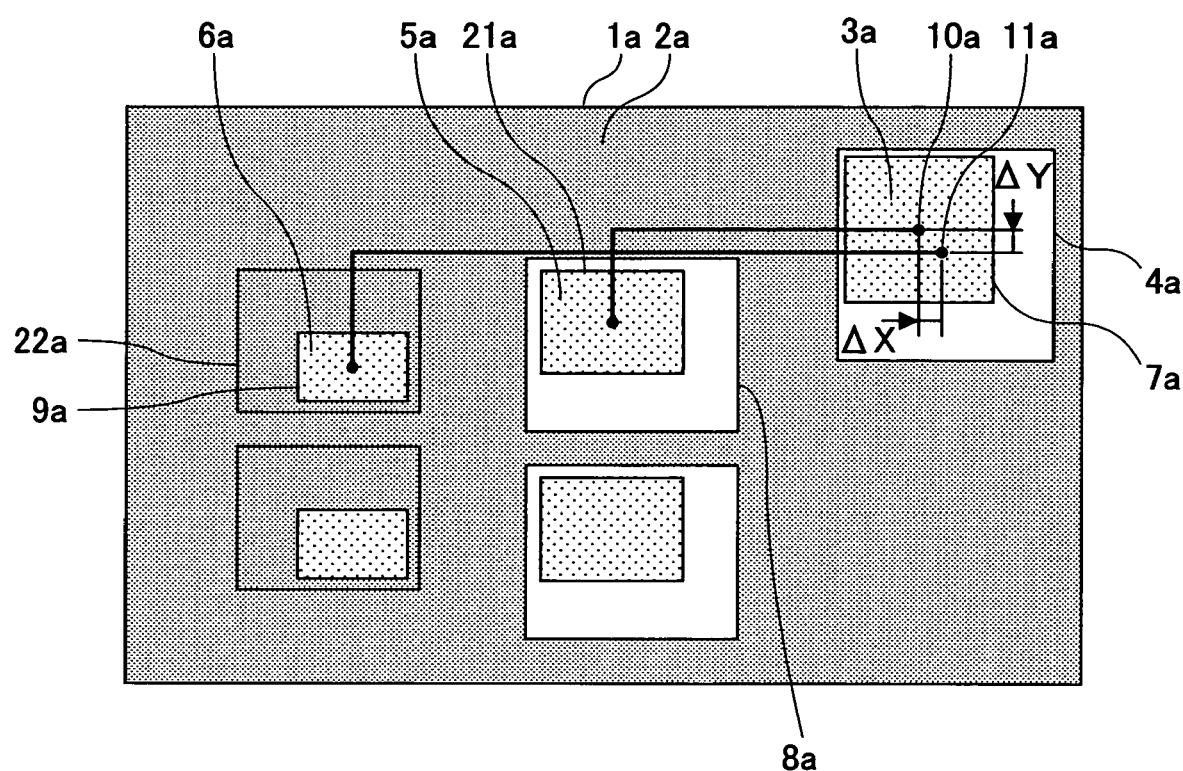
FIG. 5 is a schematic diagram illustrating a relationship between component lands and board recognition marks of a related art printed wiring board with misaligned resist.
Figure 6:
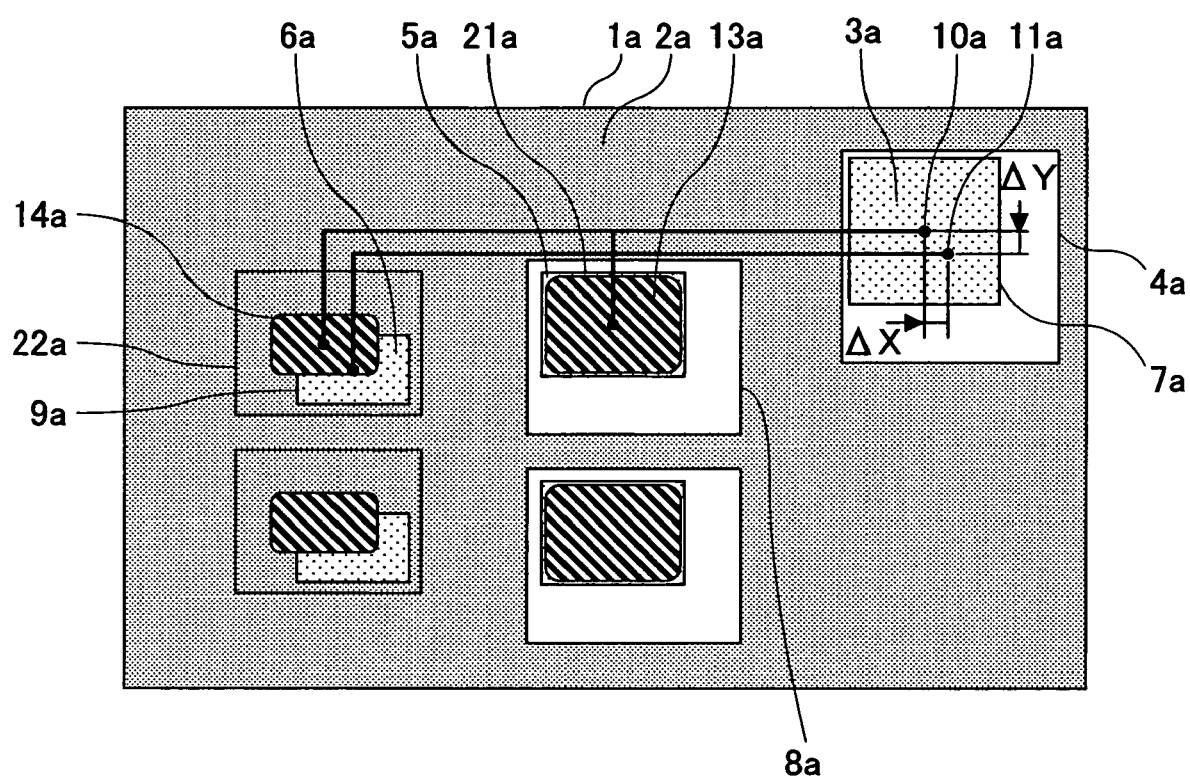
FIG. 6 is a schematic diagram illustrating solder paste printed on a related art printed wiring board with misaligned resist.
Figure 7:
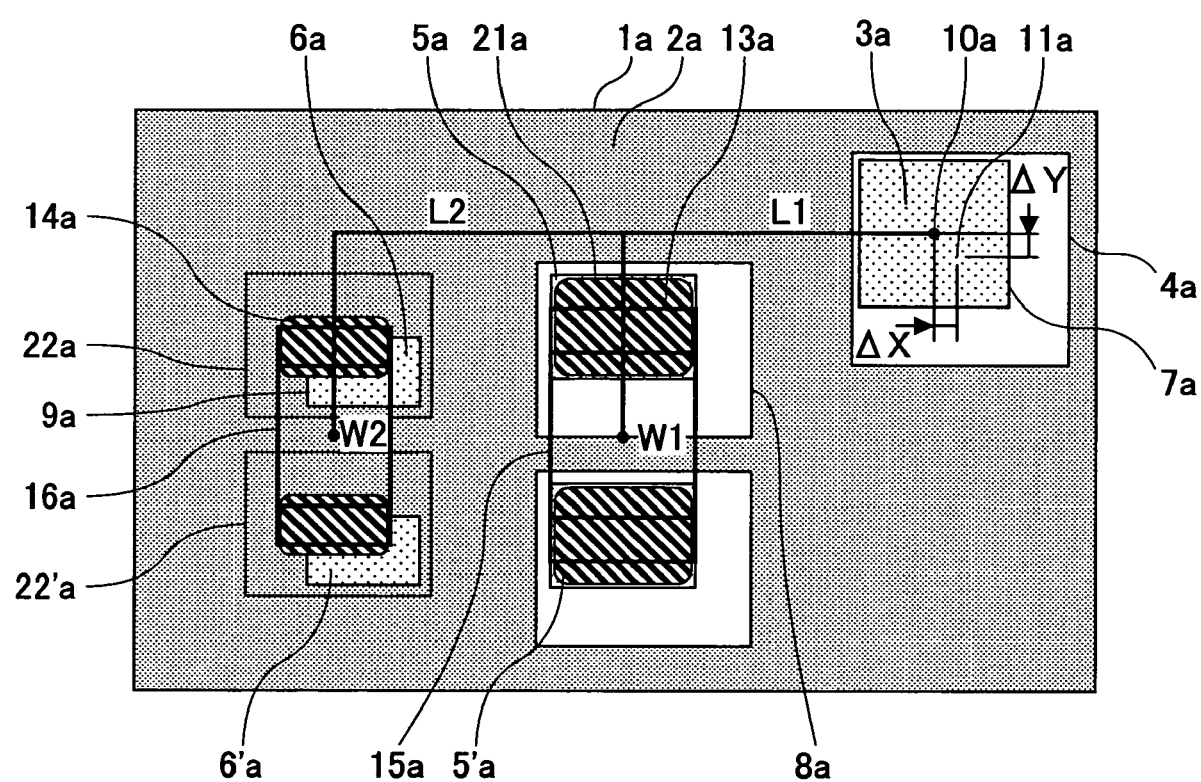
FIG. 7 is a schematic diagram illustrating components mounted on a related art printed wiring board with misaligned resist.
Figure 8A:
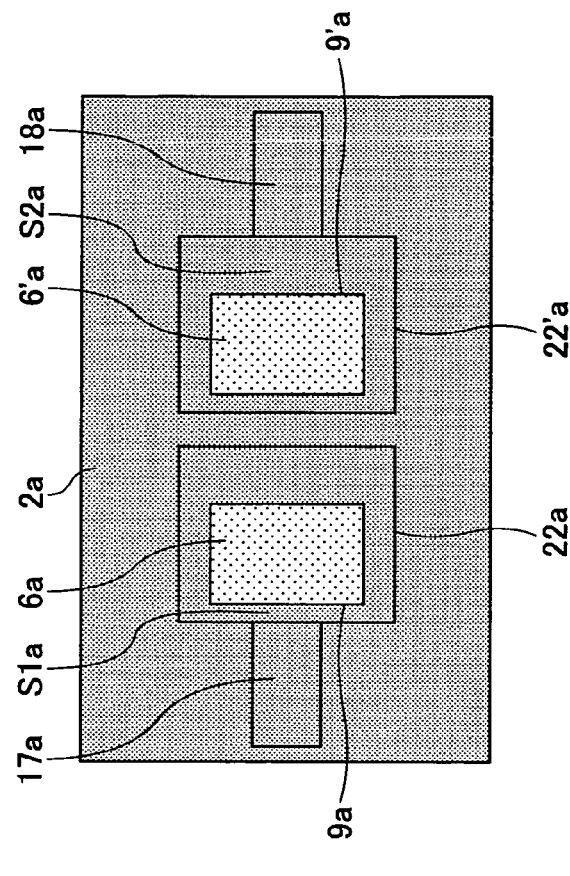
FIGS. 8A through 8C are schematic diagrams illustrating a problem with a relate art printed wiring board resulting from resist misalignment.
Figure 8B:
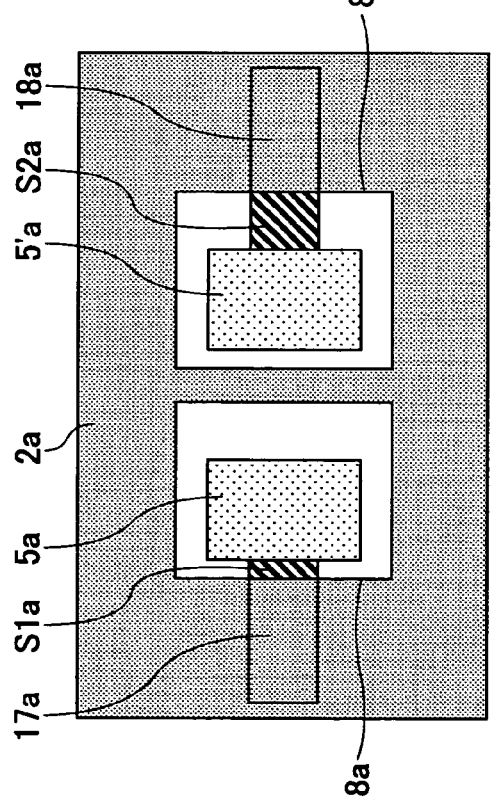
Figure 8C:
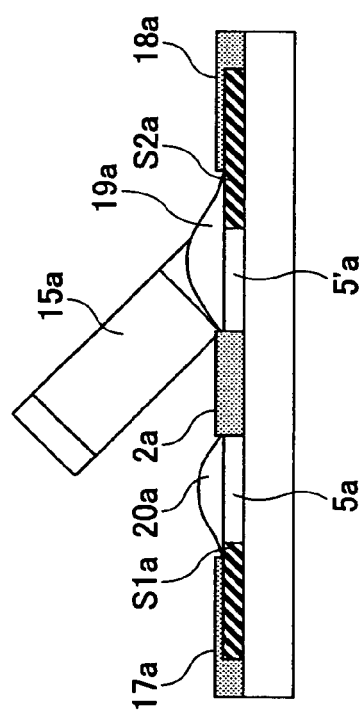

The following describes preferred embodiments of the present invention with reference to the accompanying drawings. FIG. 1 is a schematic diagram illustrating a printed wiring board 1 according to an embodiment of the present invention. FIG. 2 is a schematic diagram illustrating the printed wiring board 1 of FIG. 1 with solder pastes 13 and 14 printed thereon. FIG. 3 is a schematic diagram illustrating a first example of the printed wiring board 1 of FIG. 1 with components 15 and 16 mounted thereon. FIG. 4 is a schematic diagram illustrating a second example of the printed wiring board 1 of FIG. 1 with the components 15 and 16 mounted thereon.

Referring to FIG. 1, the printed wiring board 1 includes conductive foil 7 for a board recognition mark 3, a resist opening 4 for the board recognition mark 3, the board recognition mark 3 being defined by an area of the conductive foil 7 exposed through the resist opening 4, a normal resist type component land 5, and an over resist type component land 6. The conductive foil 7 and the resist opening 4 have the same shape and size.

The components 15 and 16 (see FIGS. 3 and 4) are to be mounted on the component lands 5 and 6, respectively.

Resist 2 (the shaded area in FIGS. 1-4) is applied through a resist printing mask (not shown) on the printed wiring board 1 including the conductive foil 7 for the board recognition mark 3, conductive foil 21 for the component land 5, and conductive foil 22 for the component land 6. The conductive foil 22 has a size large enough to accommodate the maximum resist misalignment.

The resist printing mask used for the printed wiring board 1 of this embodiment is designed to:

(a) form a resist opening 8 having a size large enough to accommodate the maximum resist misalignment so as to prevent the conductive foil 21 from being covered with the resist 2; and (b) to form a resist opening 9 such that the area of the conductive foil 22 exposed through the resist opening 9 has the design size of the component land 6 while the resist 2 covers across the circumferential area of the conductive foil 22.

The area of the conductive foil 21 exposed through the resist opening 8 and the area of the conductive foil 22 exposed through the resist opening 9 define the component land 5 and the component land 6, respectively.

The components 15 and 16 are mounted onto the printed wiring board 1 as follows. It is to be noted that the following describes a case where rightward and downward misalignment of the resist 2 exists.

First, solder paste printing is performed as follows. With reference to FIG. 2, before printing the solder pastes 13 and 14 onto the corresponding component lands 5 and 6, a printing machine captures an image of a recognition mark of a screen mask (not shown) using a CCD camera or the like, and detects a center point of the recognition mark.

Then, the printing machine captures an image of the board recognition mark 3 of the printed wiring board 1 so as to detect a center point 12 of the board recognition mark 3. The printing machine corrects misalignment between the center point of the recognition mark of the screen mask detected by the CCD camera or the like and the center point 12 of the board recognition mark 3, determines the positions of the screen mask openings (corresponding to the areas of the solder pastes 13 and 14) with respect to the component lands 5 and 6, and then prints the solder pastes 13 and 14 onto the component lands 5 and 6, respectively, through the screen mask openings.

If the resist is misaligned, since the board recognition mark 3 of the printed wiring board 1 is defined by the conductive foil 7 and the resist opening 4 having the same size and shape, the midpoint between a center point 10 of the conductive foil 7 and a center point 11 of the resist opening 4 defines the center point 12 of the board recognition mark 3.

Accordingly, the resist misalignment is distributed such that the solder pastes 13 and 14 are printed with the same degree of misalignment with respect to the corresponding component lands 5 and 6. It is to be noted that the printing machine performs the above-described printing operation according to a program stored therein in advance.

The following describes a process of mounting the components 15 and 16 onto the component lands 5 and 6, respectively, of the printed wiring board 1 with the solder pastes 13 and 14 of FIG. 2 printed thereon with use of the automatic mounter, with reference to FIGS. 3 and 4.

First, a mounting method for a printed wiring board is described according to an embodiment of the present invention with reference to FIG. 3. Referring to FIG. 3, before mounting the components 15 and 16, the automatic mounter captures an image of the board recognition mark 3 of the printed wiring board 1 with use of the CCD camera or the like so as to detect the center point 12 of the board recognition mark 3.

The automatic mounter then mounts the component 15 in a position spaced apart from the center point 12 by a distance (L3, W3), and the component 16 in a position spaced apart from the center point 12 by a distance (L4, W4). These distances are defined in a design specification of the printed wiring board 1, and are registered in a database of the mounter in advance together with the corresponding components 15 and 16.

In this embodiment, the conductive foil 7 and the resist opening 4 have the same shape and size, and the midpoint between the center point 10 of the conductive foil 7 and the center point 11 of the resist opening 4 define the center point 12 of the board recognition mark 3. Therefore, when resist misalignment exists, the resist misalignment is distributed such that the component lands 5 and 6 are mounted with the same degree of misalignment with respect to the corresponding component lands 5 and 6. The solder paste printing positions are aligned with the component mounting positions.

Next, a mounting method for a printed wiring board is described according to a modified embodiment of the present invention with reference to FIG. 4. With reference to FIG. 4, the printing machine captures an image of the board recognition mark 3 defined by the area of the conductive foil 7 exposed through the resist opening 4 with use of the CCD camera or the like, so as to find the center point 12. The printing machine then measures the size (X2, Y2) of the board recognition mark 3 so as to calculate the difference X3, Y3 from the design size X1, Y1 of the conductive foil 7.

The printing machine divides the difference X3, Y3 by two to obtain X4, Y4, and adds or subtracts X4, Y4 to the X coordinate and the Y coordinate of the center point 12 of the board recognition mark 3 in accordance with resist misalignment direction so as to find the center point 10 of the conductive foil 7 and the center point 11 of the resist opening 4.

A distance (L5, W5) and a distance (L6, W6) from the center point 12 of the board recognition mark 3 to the mounting positions of the components 15 and 16 are defined in the design specification of the printed wiring board 1. The component 15 is mounted onto the normal resist type component land 5 (not covered with the resist 2) with reference to the center point 10 of the conductive foil 7, whereas the component 16 is mounted onto the over resist type component land 6 (covered with the resist 2) with reference to the center point 11 of the resist opening 4. Thus, the components 15 and 16 are mounted in correct positions even if resist misalignment exists. It is to be noted that the automatic mounter performs the mounting operation for the printed wiring board 1 described with reference to FIGS. 3 and 4 according to a program downloaded therein in advance. The automatic mounter selectively uses the reference points depending on the component lands according to this program.

As described above with reference to FIGS. 1-4, the printed wiring board 1 includes the component land 6 covered with the resist 2 and the component land not covered with the resist 2. The conductive foil 7 and the resist opening 4 have the same shape and size. The board recognition mark 3 is defined by the area of the conductive foil 7 exposed from the resist opening 4. The image of the board recognition mark 3 is captured by an imaging device such as the CCD camera so as to find the center point 12 of the board recognition mark 3. The center point 12 is used as a reference point. It is therefore possible to equalize the misalignment amount of the printed solder paste 14 and the mounted component 16 with respect to the component land 6 covered with the resist 2 to the misalignment amount of the printed solder paste 13 and the mounted component 15 with respect to the component land 5 not covered with the resist 2 if resist misalignment occurs.

In the process of printing the solder pastes 13 and 14 onto the printed wiring board 1, the image of the board recognition mark 3 defined by the area of the conductive foil 7 exposed from the resist opening 4 is captured by the imaging device such as the CCD camera so as to find the center point 12 of the board recognition mark 3. Then the solder pastes 13 and 14 are printed with reference to the center point 12 so as to equalize the misalignment amount of the solder paste 14 with respect to the component land 6 covered with the resist 2 to the misalignment amount of the solder paste 13 with respect to the component land 5 not covered with the resist 2. Accordingly, the need for printing position correction can be eliminated.

In the process of mounting the components 15 and 16 onto the printed wiring board 1 with use of the automatic mounter, the image of the board recognition mark 3 defined by the area of the conductive foil 7 exposed from the resist opening 4 is captured by the imaging device such as the CCD camera so as to find the center point 12 of the board recognition mark 3. Then the components 15 and 16 are mounted with reference to the center point 12 so as to equalize the misalignment amount of the component 16 with respect to the component land 6 covered with the resist 2 and the misalignment amount of the component 15 with respect to the component land 5 not covered with the resist 2. Accordingly, the need for mounting position correction can be eliminated In the modified embodiment, in the process of mounting the components 15 and 16 onto the printed wiring board 1 with use of the automatic mounter, the image of the board recognition mark 3 defined by the area of the conductive foil 7 exposed from the resist opening 4 is captured by the imaging device such as the CCD camera so as to find the center point 12 of the board recognition mark 3. Further, as described with reference to FIG. 4, the size (X2, Y2) of the board recognition mark 3 is measured so as to calculate the difference X3, Y3 from the design size X1, Y1 of the conductive foil 7. The calculated difference X3, Y3 is divided by two to obtain X4, Y4, and. X4, Y4 is added or subtracted to the X coordinate and the Y coordinate of the center point 12 of the board recognition mark 3 in accordance with the resist misalignment direction so as to find the center point 10 of the conductive foil 7 and the center point 11 of the resist opening 4. Then the component 15 is mounted onto the component land 5 not covered with the resist 2 with reference to center point 10 of the conductive foil 7. On the other hand, the component 16 is mounted onto the component land 6 covered with the resist 2 with reference to the center point 11 of the resist opening 4. Accordingly, the components 15 and 16 are properly mounted even if resist misalignment occurs.

It is to be understood that the present invention is not limited to the preferred embodiments illustrated herein, and variations and modifications may be made without departing from the scope of the present invention.

The present application is based on Japanese Priority Application No. 2005-078496 filed on Mar. 18, 2005, with the Japanese Patent Office, the entire contents of which are hereby incorporated by reference.

What is claimed is:

1. A method of printing solder paste onto a printed wiring board with use of a printing machine, the printed wiring board including a board recognition mark formed of a conductive foil, a first component land covered with resist, and a second component land not covered with the resist, wherein the board recognition mark is defined by an area of the conductive foil exposed from a resist opening having the same shape and size as the conductive foil, the method comprising:

capturing an image of the board recognition mark defined by the area of the conductive foil exposed from the resist opening with use of an imaging device to find a center point of the board recognition mark; and printing first and second solder pastes with reference to the center point to equalize a misalignment amount of the first solder paste with respect to the first component land covered with the resist and a misalignment amount of the second solder paste with respect to the second component land not covered with the resist.

2. A method of mounting components onto a printed wiring board with use of an automatic mounter, the printed wiring board including a board recognition mark formed of a conductive foil, a first component land covered with resist, and a second component land not covered with the resist, wherein the board recognition mark is defined by an area of the conductive foil exposed from a resist opening having the same shape and size as the conductive foil, the method comprising:

capturing an image of the board recognition mark defined by the area of the conductive foil exposed from the resist opening with use of an imaging device to find a center point of the board recognition mark; and mounting the first and second components with reference to the center point to equalize a misalignment amount of the first component with respect to the first component land covered with the resist and a misalignment amount of the second component with respect to the second component land not covered with the resist.

3. A method of mounting components onto a printed wiring board with use of an automatic mounter, the printed wiring board including a board recognition mark formed of a conductive foil, a first component land covered with resist, and a second component land not covered with the resist, wherein the board recognition mark is defined by an area of the conductive foil exposed from a resist opening having the same shape and size as the conductive foil, the method comprising:

capturing an image of the board recognition mark defined by the area of the conductive foil exposed from the resist opening with use of an imaging device to find a center point of the board recognition mark;

measuring a size X2, Y2 of the board recognition mark to calculate a difference X3, Y3 from a design size of the conductive foil X1, Y1;

dividing the difference X3, Y3 by two to obtain X4, Y4;

adding or subtracting X4, Y4 to an X coordinate and a Y coordinate of the center point of the board recognition mark in accordance with a misalignment direction of the resist to find a center point of the conductive foil and a center point of the resist opening;

mounting the first component onto the first component land not covered with the resist with reference to the center point of the conductive foil; and mounting the second component onto the second component land covered with the resist with reference to the center point of the resist.

* * * * *